United States Patent [19]

Cathey, Jr.

[11] Patent Number: 5,096,536
[45] Date of Patent: Mar. 17, 1992

[54] METHOD AND APPARATUS USEFUL IN THE PLASMA ETCHING OF SEMICONDUCTOR MATERIALS

[75] Inventor: David A. Cathey, Jr., Boise, Id.

[73] Assignee: Micron Technology, Inc., Boise, Id.

[21] Appl. No.: 536,732

[22] Filed: Jun. 12, 1990

[51] Int. Cl.$^5$ .................................................. C23F 1/00
[52] U.S. Cl. ..................................... 156/643; 118/724; 156/345; 156/646; 204/298.31
[58] Field of Search ............... 156/625, 643, 646, 345; 204/298.31; 118/724

[56] References Cited

U.S. PATENT DOCUMENTS

| | | | |
|---|---|---|---|
| 4,771,730 | 9/1988 | Tezuka | 156/345 |
| 4,842,683 | 6/1989 | Cheng et al. | 156/345 |
| 4,931,135 | 6/1990 | Horiuchi et al. | 156/345 |
| 4,963,713 | 10/1990 | Horiuchi et al. | 156/345 |
| 4,999,320 | 3/1991 | Douglas | 156/646 |

Primary Examiner—Donald E. Czaja
Assistant Examiner—Anthony Weier
Attorney, Agent, or Firm—William J. Bethurum

[57] ABSTRACT

In a plasma reaction chamber or the like having a supporting electrode for receiving a selected substrate to be etched, a coolant gas is introduced into one region between this substrate and electrode for increasing the heat transfer capacity therebetween. Differential sealing means are provided adjacent to the coolant gas receiving region and define an enclosed space between the substrate and its supporting electrode to which a partial vacuum may be applied. This partial vacuum prevents any cooling gas from by-passing the sealing means and entering the plasma reaction chamber and producing deleterious chemical reaction effects therein.

3 Claims, 1 Drawing Sheet

1

METHOD AND APPARATUS USEFUL IN THE PLASMA ETCHING OF SEMICONDUCTOR MATERIALS

TECHNICAL FIELD

This invention relates generally to plasma and similar types of dry etching systems useful in etching semiconductor wafers and more particularly to an improved process and apparatus for controlling the wafer temperature in such systems.

BACKGROUND ART

Plasma etching systems have been used now for several years in the semiconductor manufacturing industry as an alternative material-removal method to the earlier so-called wet etching processes. In these earlier wet etching processes, material removal from a semiconductor substrate or the like was accomplished by the chemical interaction between a liquid etching compound or mixture in direct physical contact with the material to be removed. On the other hand, plasma etching systems rely upon molecular/atomic (ionic) particle acceleration and bombardment of a material to be removed. These particles will typically be certain ion species which may be made available from a plasma reaction in a gas reaction chamber which is operated under carefully controlled conditions of temperature and pressure.

Plasma etching systems are generally well known in the art and are described in the following publications incorporated herein by reference:

(1) *Plasma Etching in Semiconductor Fabrication* by Russel A. Morgan, Elsevier Press, Copyright 1985.

(2) *Glow Discharge Processes* by Brian Chapman, Wiley & Co., Copyright 1980.

(3) *Materials Research Society Symposia Proceedings,* Volume 68 ("Plasma Processing") by J. W. Coburn, R. A. Gottschio and D. W. Hess.

One type of plasma gas reaction chamber contains charged electrodes between which electrons are accelerated to collide with certain gas molecules to thereby free up the ions species from these molecules which can then be accelerated in the presence of an electrical field and caused to bombard the surface of the semiconductor material desired to be removed. These plasma etching systems thus have been referred to as "dry" etching systems in contrast to the earlier used wet etching systems and have many advantages over these earlier wet etching systems as is well-known in the art.

Standard plasma etching equipment used, for example, in the semiconductor industry for etching semiconductor wafers includes, among other things, a plasma chamber surrounding an electrode for receiving a semiconductor wafer in direct contact with the electrode surface. This electrode provides the physical support for the wafer and electrical potential necessary for the acceleration of ions as mentioned above into bombardment with the semiconductor wafer or substrate. The electrode also provides an integral part of the plasma etching apparatus necessary for cooling the wafer during the plasma etching process. In addition, this cooling is necessary to prevent degradation of the etch mask as well as to consistently control polymer and inorganic depositions which determine profiles of the etched features. The etch rate of a silicon wafer in a plasma etching system can be selectively controlled by controlling the temperature of the wafer being etched. Also, the etch rate of a photoresist polymer used as an etch mask on the wafer goes up significantly with an increase in temperature, so here is another reason for maintaining good cooling and heat transfer away from the wafer.

In order to provide the necessary high vacuum environment in the gas reaction chamber required for plasma etching, it is necessary to pump the front side of the wafer down to high vacuum levels of pressure so that typically the front or top side of the wafer in the plasma chamber 10 will be at a pressure in the range of 0 to 1.0 Torr and the back or lower side of the wafer will be pumped down to a partial vacuum in the range of 1.0 to 10.0 Torr. However, since the wafer and electrode are not normally perfectly flat, there will not be a 100% surface contact between the wafer and the supporting electrode. This characteristic in turn serves to create high vacuum voids in certain non-contact regions between the wafer and electrodes which, if not filled with certain gas molecules, will provide a poor heat transfer path for conducting heat away from the wafer and to the electrode. As will be described in further detail below, it is imperative to provide good cooling of the wafer and good heat transfer therefrom to the underlying supporting metal electrode.

To correct this latter problem of poor heat transfer between the wafer being etched and the underlying supporting metal electrode which would otherwise be created by high vacuum voids between these two components, so called "helium back side cooling" systems have been proposed and designed wherein helium gas is used to fill these high vacuum voids between the wafer and supporting electrode.

In the past, plasma etching equipment has used essentially two different designs for providing such helium back side cooling to the side of the semiconductor wafer in direct contact with the supporting electrode. The first of these designs employs a single O-ring seal between the respective peripheries of the wafer and electrode, and a gas supply line is connected between a central opening in the electrode and a source of cooling gas for introducing this gas into the closed region between wafer and electrode which is bounded peripherally by the O-ring seal. A peripheral clamp is used to secure the wafer and electrode tightly together in the vicinity of the O-ring seal.

A second design is somewhat similar to the above first design but does not use a seal between wafer and supporting electrode and instead merely relies upon the clamping action between wafer and electrode to form a barrier that will tend to keep the cooling gas such as helium out of the main plasma gas reaction chamber.

Whereas the above two prior art designs have operated satisfactorily in some respects, neither of these two designs have proven entirely adequate as a totally reliable means for keeping the helium gas from exiting the region between wafer and electrode and escaping (if only slightly) into the main gas reaction chamber. This is particularly true if the back side pressure in the chamber 10 is operated at a pressure of greater than 10 Torr.

DISCLOSURE OF INVENTION

The general purpose and principal object of the present invention is to provide a new and improved method and apparatus for improving the sealability between a plasma used to etch a wafer and its underlying supporting metal electrode which is operative to substantially improve the sealing characteristics between the wafer and electrode. This is done in such a manner as to allow greater-than-ever-before-possible differential pressures to be applied to the outer exposed surfaces of the wafer and electrode, respectively. This is done without leaking any cooling gas such as helium from the space between the wafer and electrode into the main plasma reaction chamber. This novel feature of the present invention has simply not been achievable with complete reliability using the above prior art plasma etcher designs.

Another object of this invention is to provide a new and improved method and apparatus of the type described which is operative to provide improved cooling of and heat transfer away from a semiconductor wafer being etched in a plasma etching system.

Another object of this invention is to provide a new and improved method and apparatus of the type described which is compatible for use and retrofitting with existing plasma etching equipment and designs.

A further object of this invention is to provide a new and improved method and apparatus of the type described which may be implemented at a relatively low cost and in a straight-forward manner. This apparatus embodies a novel mechanical sealing design of plasma etching apparatus which is highly reliable in operation.

These and other objects, advantages, and novel features of this invention are made possible by the provision of a differential sealing method and apparatus which is located and operable between a semiconductor wafer to be etched and a supporting electrode therefor. The method according to the present invention includes the steps of:

a. providing a first closed seal at one radial distance from a central point on a semiconductor wafer for defining the lateral boundary of a confined gas receiving region between the wafer and a support electrode therefor, b. providing a second closed seal at a second and greater radial distance from the central point on the wafer and, together with the first closed seal, defines an enclosed annular region adjacent to the periphery of the wafer, c. pumping a heat transfer gas to the gas receiving region, and d. providing a partial vacuum to the enclosed annular region. Using this arrangement, any gas leaking from the gas receiving region into the enclosed annular region between the wafer and supporting electrode will be pumped toward a vacuum pump and away from the second closed seal and thereby be prevented from entering a main plasma etching reaction chamber surrounding the wafer.

The apparatus according to the present invention includes, among other things, means for providing a first closed seal at one radial distance from a central point on the wafer and means for providing a second closed seal at a second and greater radial distance from the central point on the wafer, with both closed seals being located between the wafer and a metal electrode supporting same. Additionally, there is provided means for pumping a heat transfer gas to a gas receiving region between the wafer and its supporting electrode, and means are further provided and connected between the first and second closed seals for providing a partial vacuum therebetween. Any gases having a tendency to leak radially across the first seal will be pumped toward a vacuum pump which is connected to the enclosed region between the two seals and away from the second closed seal. This configuration prevents any coolant gas from entering a main plasma etching reaction chamber and contaminating the chemicals and gaseous reaction elements and compounds therein.

The above and other objects, features, and advantages of this invention will become more readily apparent in the following description of the accompanying drawings.

DETAILED DESCRIPTION OF THE PREFERRED EMBODIMENT

Figure 1:
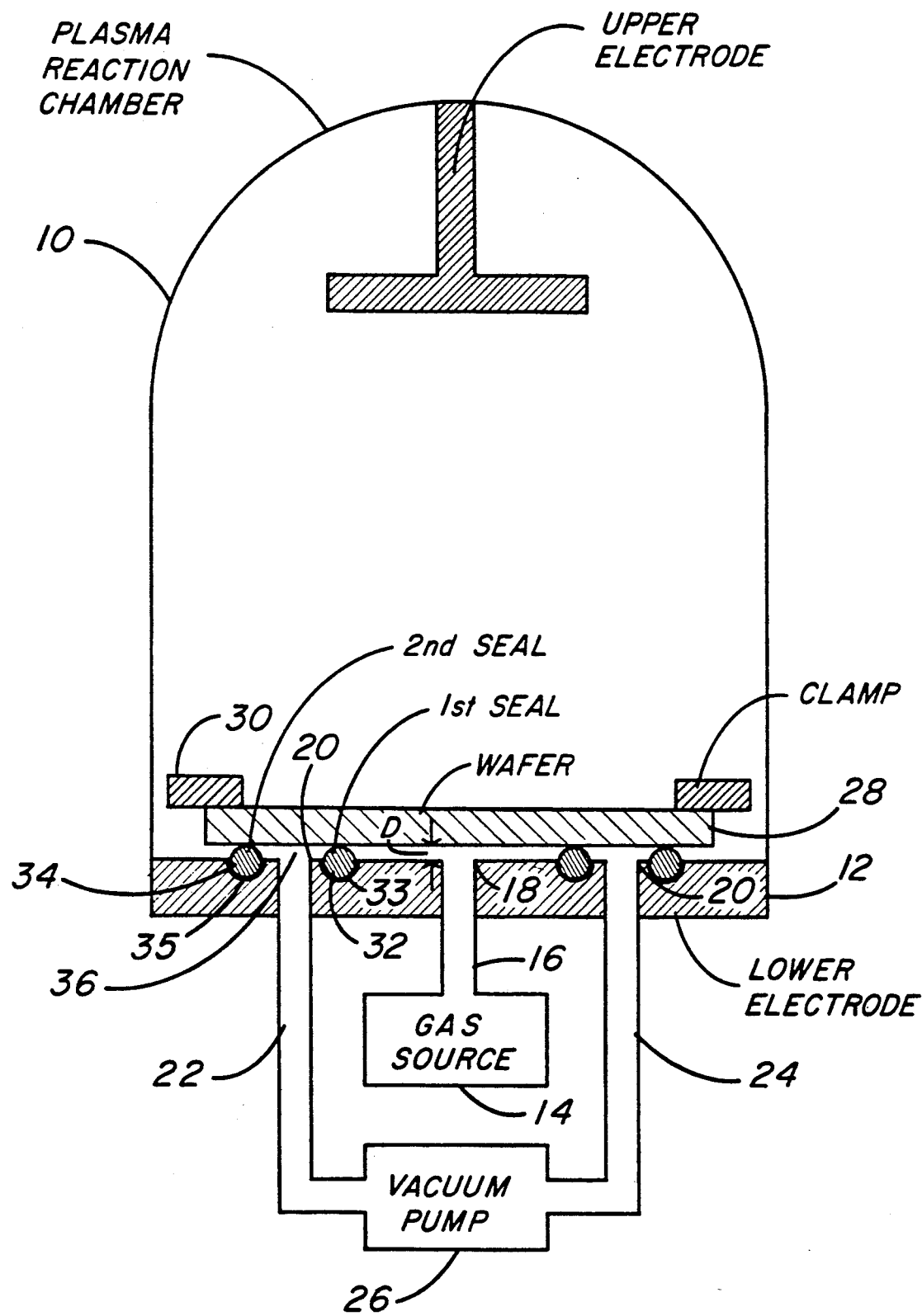
FIG. 1 is a schematic cross-sectional view illustrating the plasma etching method and apparatus according to this invention.

Referring now to FIG. 1, there is shown a plasma reaction chamber 10 which is mounted as shown on a lower electrode member 12 connected to receive a cooling and heat transfer gas such as helium from a gas source 14. The gas source 14 is connected by way of a gas flow line 16 to a central opening 18 in the lower supporting electrode 12. The electrode 12 also has an outer annular opening 20 connected as shown to a pair of vacuum lines 22 and 24 which are in turn connected to a vacuum pump 26.

A selected substrate such as a semiconductor wafer 28 is mounted as shown above the upper surface of the plasma electrode 12 and is clamped in place thereover by a clamping means 30 shown schematically in the figure. The semiconductor wafer 28 is positioned to rest on both a first or inner peripheral annular sealing member 32 and upon an outer peripheral annular sealing member 34 positioned as shown on each side of the annular opening 20 in the electrode 12. The distance D defines the cooling gas receiving region in FIG. 1 and is greatly enlarged for ease of illustrating the other members of the improved apparatus of the preferred embodiment. In actual practice, the above O-ring sealing members 32 and 34 are compressed under the force applied by the clamp 30 or by electrostatic attraction between the wafer and the electrode. In this manner, the wafer's lower surface is drawn down into either actual contact with the electrode 12 or to within about 0.005 inches of the top surface of the electrode 12. These sealing members 32 and 34 are preferably constructed of a polymeric material and are tightly compressed into a pair of annular matching grooves 33 and 35, respectively. These O-rings 32 and 34 will typically be about 0.1 to 0.25 inches in cross section dimension in an un-flexed condition.

The abutting surfaces of the semiconductor wafer 28 and the lower electrode 12 of the plasma etch system are not perfectly flat. Therefore, if the wafer 28 was clamped directly on the upper surface of the electrode 12, there would be small voids created at certain lateral locations between the lower surface of the wafer 28 and the upper surface of the plasma electrode 12. Unless these voids are filled with a good heat transfer gas such as helium, they produce poor heat transfer pockets between the wafer 28 and supporting electrode 12 and thereby prevent good wafer cooling as is required in these types of plasma etching systems. The higher the gas pressure is between the wafer 28 and the lower electrode 12, the more effective the rate of heat transfer will be between the wafer 28 and the electrode 12. This cooling is necessary for, among other reasons, preventing etching of photoresist patterns (not shown) on the wafer 28 which increases rapidly with increases in temperature.

For reasons given above, a helium gas is provided to fill the above voids by the use of a gas source 14 and a gas feed line 16 which extends through the central gas-receiving opening 18 of the electrode 12 to fill the enclosed region with helium between the wafer 28 and electrode 12 and bounded radially by the inner or first seal 32. However, in the absence of using a second or outer seal 34 in accordance with the teachings of the present invention, the high differential pressures developed across the outer surfaces of the electrode 12 and wafer 28 respectively can cause helium gas to leak radially outward from the first seal 32 and into the plasma reaction chamber 10. This leaking gas will then become mixed with the highly sensitive chemicals used in the plasma reaction chamber 10 and produce undesirable and spurious reaction products therein.

To prevent such unwanted cooling gas leakage, a second seal 34 is provided as shown adjacent to the outer side of the annular opening 20 in the electrode 12 and there defines an annular partial vacuum receiving region 36 between the first and second peripheral seals 32 and 34. Thus, should any helium gas escape across the surfaces of the first seal 32 and into the annular region 36, such gas would immediately be drawn downwardly through the opening 20 in the lower plasma electrode 12 and through the gas feed line 22 and into the vacuum pump 26. The differential pressure which is also developed across the first seal 32 will thereby prevent any coolant gas such as helium entering the annular region 36 from further leaking radially outward across the second seal 34 and undesirably contaminating the chemical system within the plasma reaction chamber 10 as previously described.

Thus, in accordance with the present invention, plasma etching systems such as the one shown in FIG. 1 may now be operated with a main chamber 10 pressure in the range of zero to 1.0 Torr and a pressure in the cooling region between the wafer 28 and the electrode 12 in the range of 1.0 to 10.0 Torr or greater to thereby provide excellent cooling of and heat transfer from the wafer 28 during a plasma etching operation.

The semiconductor wafer 28 will typically be a composite substrate structure (not shown) having a glass underlayer upon which a layer of polycrystalline silicon is deposited and further wherein a silicon dioxide layer is deposited uniformly across the top of the polysilicon layer. Further, the selected substrate material defining the wafer 28 may further include an outer photoresist mask which has been developed and defined using known photolithographic techniques prior to mounting the substrate (wafer 28) in the position shown in FIG. 1. Thus, a cross-section of a typical composite wafer structure defining the substrate 28 might include a glass underlayer covered by a layer of polysilicon which is in turn covered by a layer of silicon dioxide and a photoresist mask which serves as a plasma etch mask for the plasma etching reaction carried out in the reaction chamber 10.

This etching reaction may include, for example, the use of an inert gas such as argon in combination with the gases triflouromethane, $CHF_3$, and carbon tetraflouride, $CF_4$, as the active gas reactants in the dry etching process. The gas $CF_4$ (also known as "Freon 14") is used to control the etch rate in the system, whereas the gas $CHF_3$ (also known as "Freon 23") is utilized to slow down the etch rate on silicon without significantly retarding the etch rate of the silicon dioxide layer. In this manner, the silicon dioxide layer areas which are exposed by openings in the photoresist mask may be rapidly etched away by the bombarding ion species which are reaction products of the plasma reaction system. Thereafter, the ion etching process is rapidly slowed down once the silicon dioxide layer has been completely removed to expose the polysilicon underlayer previously described.

Thus, there has been described a new and improved method and apparatus for operating plasma etching systems and the like wherein heat is transferred from the plasma to the front of the wafer and then transferred through the wafer to the back side region adjacent thereto. By enabling this back side region to be operated at higher gas pressures than were heretofore possible, heat can be removed from the wafer at a higher rate than was heretofore attainable. The result of this operation is that lower front side wafer temperatures are made possible thereby, with the attendant advantages previously described.

Various modifications may be made in the above described preferred embodiment without departing from the scope of this invention. For example, the apparatus described above is not limited to the use of mechanical clamping means 30, but may instead utilize electrostatic clamping to firmly secure the wafer 28 against the upper surfaces of the first and second annular seals 32 and 34.

The present invention may be readily practiced using a Model 5000 E type dry etcher available from the Applied Materials Corporation of Santa Clara, Calif., but may be equally useful on other dry etchers such as reactive ion etchers, magnetron etchers, electro-cyclotron-resonance (ECR) etchers, downstream etchers, tri-electrode design etchers and magnetically-confined plasma etchers.

The present invention is not limited to the use of O-ring type seals, and may be used in combination with lip-type seals and seals of other suitable configurations. Accordingly, the above and other design and process modifications which may be made by those skilled in the art are clearly within the scope of the following appended claims.

What is claimed is:

1. A method for cooling selected substrates treated in plasma etching systems having a substrate-supporting electrode disposed within a plasma reaction chamber and operative to receive said selected substrate above one surface thereof, said method including the steps of:
   a. providing a first closed seal at one radial distance from a central point on said selected substrate and between said substrate and electrode for defining the lateral boundary of a gas receiving region between said substrate and said support electrode therefor,
   b. providing a second closed seal at a second and greater radial distance from said central point on said selected substrate and, together with said first closed seal, defining an enclosed region adjacent to the periphery of said substrate,
   c. passing a heat transfer gas to said gas receiving region, and
   d. providing a partial vacuum to said enclosed region for preventing said heat transfer gas from leaking radially across said second seal.

2. Apparatus for cooling selected substrates treated in plasma etching systems having a substrate-supporting electrode disposed within a plasma reaction chamber and operative to receive a selected substrate above one surface thereof, said apparatus including, in combination:

a. a first closed seal at one radial distance from a central point on said electrode and between said substrate and said electrode for defining the lateral boundary of a gas receiving region between said substrate and said support electrode therefor, b. a second closed seal at a second and greater radial distance from said central point on said electrode and, together with said first closed seal, defining an enclosed region adjacent to said gas receiving region, c. means coupled to said gas receiving region for passing a heat transfer gas thereto, and d. means coupled to said enclosed region for providing a partial vacuum thereto and thereby preventing said heat transfer gas from leaking radially across said second seal.

3. The apparatus defined in claim 2 wherein said first and second closed seals are concentric O-ring seals, and said substrate and said supporting electrode therefor are spaced apart from an ion generating electrode within a plasma etching chamber.

* * * * *